(12) United States Patent
Naba et al.

(10) Patent No.: US 6,426,154 B1
(45) Date of Patent: Jul. 30, 2002

(54) CERAMIC CIRCUIT BOARD

(75) Inventors: Takayuki Naba, Chigasaki; Hiroshi Komorita, Yokohama; Noritaka Nakayama; Kiyoshi Iyogi, both of Kawasaki, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/668,747

(22) Filed: Sep. 25, 2000

(30) Foreign Application Priority Data

Sep. 28, 1999 (JP) .......................................... 11-274817
Sep. 29, 1999 (JP) .......................................... 11-277589

(51) Int. Cl.[7] .......................... B32B 7/04; B32B 15/04; B32B 15/20; H01L 23/14; H01L 29/12; H05K 1/02; H05K 3/38

(52) U.S. Cl. ..................... 428/620; 428/548; 428/554; 428/573; 428/601; 428/627; 428/629

(58) Field of Search .................. 428/620, 548, 428/554, 557, 573, 601, 627, 628, 629, 632, 650, 652

(56) References Cited

U.S. PATENT DOCUMENTS

| | | | |
|---|---|---|---|
| 4,602,731 A | * | 7/1986 | Dockus |
| 4,803,450 A | * | 2/1989 | Burgess et al. |
| 5,213,877 A | * | 5/1993 | Yoshida et al. |
| 5,354,415 A | * | 10/1994 | Fushii et al. |
| 5,965,193 A | * | 10/1999 | Ning et al. |
| 6,033,787 A | * | 3/2000 | Nagase et al. |
| 6,297,549 B1 | * | 10/2001 | Hiyoshi |

FOREIGN PATENT DOCUMENTS

| | | |
|---|---|---|
| JP | 5-166968 | 7/1993 |
| JP | 8-59357 | 3/1996 |
| JP | 10-270596 | 10/1998 |

* cited by examiner

Primary Examiner—Deborah Jones
Assistant Examiner—Jason Savage
(74) Attorney, Agent, or Firm—Oblon, Spivak, McClelland, Maier & Neustadt, P.C.

(57) ABSTRACT

The present invention provides a ceramic circuit board comprising: a ceramic substrate and a metal circuit plate bonded to the ceramic substrate through a brazing material layer; wherein the brazing material layer is composed of Al—Si group brazing material and an amount of Si contained in the brazing material is 7 wt % or less. In addition, it is preferable to form a thinned portion, holes, or grooves to outer peripheral portion of the metal circuit plate. According to the above structure of the present invention, there can be provided a ceramic circuit board having both high bonding strength and high heat-cycle resistance, and capable of increasing an operating reliability as electronic device.

28 Claims, 7 Drawing Sheets

CERAMIC CIRCUIT BOARD

BACKGROUND OF THE INVENTION

1. Field of the Invention

The present invention relates to a ceramic circuit board comprising both high heat-cycle characteristic and high bonding strength characteristic that are suitable for a high-power transistor module circuit board, and more particularly, to a ceramic circuit board to which high thermal conductivity and high strength are imparted by bonding a metal circuit plate such as aluminum circuit plate to ceramic substrate such as silicon nitride substrate.

2. Description of the Related Art

Conventionally, a ceramic circuit board formed by bonding a metal circuit plate to a ceramic substrate has been widely applied to various electronic parts and machinery parts. Further, as a substrate for mounting electronic parts such as semiconductor chip or the like, various substrates such as ceramic substrate and resin substrate or the like have been practically used. Among these substrates, the ceramic substrate has been mainly used as the substrate for mounting a highly-heat radiating electronic part, because the ceramic substrate has an excellent insulating property and high-heat radiating property or the like.

Up to now, as the ceramic substrate, alumina sintered body has been mainly used because the alumina sintered body has been easily available. However, in accordance with an increase of a degree of integration, frequency, output power or the like of the semiconductor chip in these days, there is a tendency that an amount of heat to be generated from the semiconductor chip has remarkably increased. With respect to the tendency, the alumina substrate cannot meet the requirement for heat-radiating property. To cope with the above problem, there has been already proposed and practically used a ceramic substrate composed of aluminum nitride (AlN) sintered body having a thermal conductivity about ten-times larger than that of alumina and having a thermal expansion coefficient similar to that of Si.

That is, a circuit board having a high thermal conductivity has been widely used as parts for constituting the various electronic devices. For example, there has been widely used a ceramic circuit board in which aluminum nitride (AlN) sintered body having a high thermal conductivity of about 170 W/mK-class is used as the ceramic substrate or silicon nitride ($Si_3N_4$) sintered body having a high thermal conductivity of about 70 W/mK-class is used as the ceramic substrate.

The aluminum nitride substrate has above characteristics, however, mechanical strength and toughness of the AlN substrate are relatively small. Therefore, when the AlN substrate is tightly fastened by a screw at an assembling process of the devices using the circuit board, or when a heat cycle is applied to the AlN substrate, there may be posed a disadvantage that a crack is liable to occur. In particular, when the substrate is applied to power transistor modules for automobile, aircraft, machine tool, and robot or the like that are used and operated under severe load conditions and heat conditions, the above disadvantage would be further remarkable.

Therefore, as the ceramic substrate for mounting the electronic parts, it has been required to improve a mechanical reliability of the ceramic substrate. In this connection, there has been paid attention to a ceramic substrate composed of silicon nitride ($Si_3N_4$) sintered body having a thermal expansion coefficient similar to Si and excellences in mechanical strength and toughness, though the silicon nitride substrate is inferior to aluminum nitride substrate in thermal conductivity. In also the silicon nitride substrate, when grain size of silicon nitride material powder to be formed into sintered body and a composition of sintering agent in the material powder are appropriately controlled, a high thermal conductivity of, for example, 50 W/mK or more has been realized.

The ceramic circuit board in which silicon nitride ($Si_3N_4$) sintered body is used as the ceramic substrate can be manufactured in accordance with, for example, an active metal brazing method described hereunder.

At first, Ag—Cu—Ti group brazing material is screen-printed on a surface of silicon nitride ($Si_3N_4$) substrate, then a metal circuit plate composed of Cu is disposed on the printed surface, thereafter, a heat treatment is carried out at a temperature of about 850° C., so that the ceramic substrate and the metal circuit plate are bonded thereby to manufacture a ceramic circuit board.

In thus obtained ceramic circuit board, Ti as the active metal and N contained in the nitride type ceramic substrate are covalent-bonded to form TiN (titanium nitride), so that a bonding layer is formed by this TiN, whereby a high-bonding strength can be obtained to some extent.

However, in a case where the ceramic circuit board is applied to semiconductor module or the like to be equipped on vehicles, a severe heat-load is applied to the ceramic circuit board, so that fine cracks are disadvantageously occurred at peripheral portion of the metal circuit plate. In a case where the heat-cycle is further continued to be applied to the ceramic circuit board while remaining the fine cracks as they are, the metal circuit plate is peeled off from the ceramic substrate, so that there is posed a problem of inviting defectives in bonding strength and heat-resistance thereby to lower an operating reliability of the circuit board as an electronic device.

By the way, in the conventional ceramic circuit board formed by bonding the metal circuit plate to the ceramic substrate, a copper circuit plate has been mainly used as the metal circuit plate. This is because a copper has a high electric conductivity and low-distortion characteristic capable of obtaining an excellent circuit function.

However, in case of the ceramic circuit board where the silicon nitride substrate is used as the ceramic substrate and the copper circuit plate is used as the metal circuit plate, there can be provided a notable effect of preventing the crack formation caused by the fastening operation performed in the assembling process of the circuit board. In contrast, the effect of suppressing the crack formation to be caused by the fastening operation performed in the assembling process is still insufficient, so that there is a strong demand for the circuit plate to further improve the suppressing effect.

In addition, in recent years, a miniaturization of the electronic devices has been further advanced. In accordance with this advancement, it has been also strongly demanded to further reduce a mounting space of the circuit board. In this regard, since the conventional ceramic circuit board having a single-layered structure requires a predetermined plain surface area for being mounted to the devices or the like, so that there is a limit for reducing the mounting area.

SUMMARY OF THE INVENTION

The present invention has been achieved for solving the aforementioned problems. Accordingly, an object of the present invention is to provide a ceramic circuit board having a high bonding strength and a high-heat cycle resistance and capable of improving operating reliability as an electronic device.

Another object of the present invention is to provide a ceramic circuit board in which a silicon nitride substrate is used as a ceramic substrate, the ceramic circuit board being capable of exhibiting a remarkable effect of preventing crack formation to be caused by fastening operation performed in assembling process of the ceramic circuit board into devices, capable of greatly improve an effect of suppressing the crack formation to be caused at the silicon nitride substrate when heat cycle is applied to the ceramic circuit board in comparison with a case where a copper circuit plate is used as the metal circuit plate, whereby an availability and usability particularly in durability of the ceramic circuit board can be increased.

Still another object of the present invention is to provide a ceramic circuit board capable of contributing to reduce a mounting space for the ceramic circuit board to be mounted on a device without impairing the effect of suppressing crack formation caused by the heat cycle applied to the silicon nitride substrate.

In order to attain the objects described above, the inventors of the present invention had reviewed about various factors such as kind of a brazing material for bonding the metal circuit plate to the ceramic substrate, arrangement of a bonding layer composed of the brazing material or the like. As a result, the inventors had obtained the following findings.

The brazing material mainly composed of Al and constituting the bonding layer has a function of imparting wettability to ceramic substrates such as AlN and $Si_3N_4$ or the like, and firmly combines with the ceramic substrate thereby to metallize the ceramic substrate. Therefore, when the Al plate is applied as the metal circuit plate, it is preferable to bond the Al circuit plate to the ceramic substrate by using the brazing material mainly composed of Al.

On the other hand, when a copper plate is bonded to a ceramic substrate through the brazing material mainly composed of Al, Cu and Al are disadvantageously alloyed, so that the wettability of Al with respect to the ceramic substrate is lowered and the bonding operation becomes impossible. However, when an insulating layer composed of metal foil comprising at least one element selected from the group consisting of Ib, IIb, IIIb, IVb family elements such as Sn, In or the like prescribed in periodic table is disposed between the bonding layer and the copper plate, the insulating layer can effectively prevent Cu and Al from being alloyed to each other. As a result, it was confirmed that the ceramic substrate and the copper plate can be bonded with a high bonding strength.

Further, Sn as Ib family element and Al contained in the brazing material used for forming the insulating layer are soft metals each having an yield strength of 20 Mpa or less, so that a residual stress caused by a difference in coefficients of linear-thermal expansion between the copper plate and the ceramic substrate of the ceramic circuit board, and a thermal stress caused by the subsequent heat-load cycles applied to the circuit board can be remarkably reduced, so that a heat-cycle resistance is improved and the ceramic per se hardly cause crack due to the thermal stress. In addition, it was also confirmed that since the crack due to the heat cycle is hardly occurred, so that a bonding strength was not lowered at all.

The present invention had been achieved on the basis of the aforementioned findings. That is, according to a first aspect of the present invention, there is provided a ceramic circuit board comprising: a ceramic substrate and a metal circuit plate bonded to the ceramic substrate through a brazing material layer; wherein the brazing material layer is composed of Al—Si group brazing material and an amount of Si contained in the brazing material layer is 7 wt % or less.

In addition, in the ceramic circuit board according to the above invention, it is preferable that the ceramic substrate is composed of silicon nitride. Further, it is also preferable that the metal circuit plate is aluminum plate or aluminum alloy plate. Furthermore, it is also preferable that the aluminum alloy is Al—Si alloy. Further, it is also preferable that the metal circuit plate has a peel strength of 7 kg/cm or more.

In addition, a brazing material layer composed of Al and alkaline earth metal element or compound thereof can be also applied in place of Al—Si alloy. In this case, an amount of the alkaline earth metal element or compound thereof contained in the brazing material layer is preferably set to 12 wt % or less.

According to a second aspect of the present invention, there is provided a ceramic circuit board in which a metal circuit plate is bonded to a ceramic substrate, the ceramic circuit board comprising: a ceramic substrate composed of at least one of aluminum nitride (AlN), silicon nitride ($Si_3N_4$) and aluminum oxide ($Al_2O_3$); a bonding layer which is integrally formed to the ceramic substrate and consists of a brazing material mainly composed of Al; an insulating layer for preventing the brazing material from being alloyed with the metal circuit plate, the insulating layer being integrally formed to the bonding layer; and a metal circuit plate bonded to the ceramic substrate through the insulating layer.

In addition, in the ceramic circuit board according to the above second aspect of the present invention, it is preferable that the insulating layer is composed of a metal paste containing metal powder having a grain size of 10 μm or less, or composed of a metal foil having a thickness of 10 μm or more. Further, it is preferable that the insulating layer has a thickness of 10 μm or more. Furthermore, it is preferable that the metal constituting the metal paste or the metal foil in the insulating layer is at least one metal of Ni, Sn and In.

According to a third aspect of the present invention, there is provided a ceramic circuit board in which a metal circuit plate is bonded to a ceramic substrate, the ceramic circuit board comprising: a ceramic substrate composed of at least one of aluminum nitride (AlN), silicon nitride ($Si_3N_4$) and aluminum oxide ($Al_2O_3$); a first bonding layer which is integrally formed to the ceramic substrate and consists of a brazing material or alloy mainly composed of Al; an insulating layer for preventing the first bonding layer from being alloyed with the metal circuit plate, the insulating layer being integrally formed to the first bonding layer; a second bonding layer which is integrally formed to a surface of the insulating layer and consists of a brazing material or alloy mainly composed of Al; and a metal circuit plate bonded to the ceramic substrate through the second bonding layer.

In the ceramic circuit board according to the third aspect of the present invention, it is preferable that each of the bonding layers and the insulating layer has a thickness of 10 μm or more, respectively.

In order to achieve the aforementioned another object, according to a fourth aspect of the present invention, there is provided a ceramic circuit board comprising: a ceramic substrate; and a metal circuit plate bonded to the ceramic substrate; wherein the ceramic substrate is composed of a silicon nitride ($Si_3N_4$) substrate having a thermal conductivity of 50 W/mK or more and the metal circuit plate is composed of aluminum circuit plate, and wherein the silicon nitride substrate and the aluminum circuit plate are directly bonded without providing a brazing material layer. In this regard, as the aluminum circuit plate, single substance of Al or Al alloy is applied.

According to the fourth aspect of the present invention, since the metal circuit plate is composed of aluminum circuit plate in place of copper circuit plate, it becomes possible to greatly improve an effect of suppressing the crack formation in comparison with a case where the copper circuit plate is used, the crack being caused at silicon nitride substrate when the circuit board is used under a condition of being applied with the heat cycle.

That is, according to reviews & studies conducted by the inventors of the present invention, when copper (Cu) is applied with heat cycle of a predetermined temperature range, for example, within a range of 0° C.–100° C., the copper repeats heat-expansion and heat-contraction by causing elastic deformation thereby to maintain a constant shape (flat pattern in case of flat plate). This means for the ceramic circuit board formed by bonding the copper circuit plate to the silicon nitride substrate that the expansion and contraction caused by the heat cycle applied to the copper circuit plate are normally and regularly applied to the silicon nitride substrate. Due to these expansion and contraction of the copper circuit plate, a large stress is caused at the silicon nitride substrate whereby such stress has become a cause of forming the crack, allgatoring, crazing or the like.

In contrast, in aluminum, a plastic deformation caused by the heat cycle is liable to remain in the aluminum. For example, when the aluminum is applied with the heat cycle within a temperature range of 0° C.–100° C., the plastic deformation is gradually accumulated. Namely, the heat-expansion is accumulated, so that the aluminum is brought into a state where fine corrugations or wrinkles are formed in case of aluminum flat plate.

Accordingly, in case of the ceramic circuit board formed by bonding the aluminum circuit plate to the silicon nitride substrate, the aluminum circuit plate per se is deformed by the heat cycle while the stress due to the heat cycle is hardly caused to the silicon nitride substrate. Therefore, the cracks or allgatorings or the like hardly occur to the silicon nitride substrate.

Based on the above mechanism, in the ceramic circuit board according to fourth aspect of the present invention in which aluminum circuit plate is used as the metal circuit plate, it becomes possible to greatly improve an effect of suppressing the crack formation in comparison with a case where the copper circuit plate is used, the crack being caused at silicon nitride substrate when the circuit board is used under a condition where the heat cycle is applied.

In the ceramic circuit board according to fourth aspect of the present invention, in order to secure a high heat-radiating property of the ceramic circuit board, the silicon nitride substrate is required to have a thermal conductivity of 50 W/mK or more.

In addition, the ceramic circuit board according to fourth aspect of the present invention is characterized in that the silicon nitride substrate and the aluminum circuit plate are directly bonded without providing a brazing material layer therebetween. When Al—Si alloy plate containing Si is used as aluminum circuit plate, a more excellent bonding strength can be obtained. This means that Al brazing material layer used in the first and second aspects of the invention is replaced by Al plate or Al alloy plate, so that Al—Si alloy plate can exhibit effects as both a bonding layer and a circuit plate.

The present invention includes the above first to fourth inventions according to the respective aspects. The Si amount contained in the Al brazing material layer is preferably set to 7 wt % or less in the first invention. While, it is preferable to set the Si amount to 50 wt % or less in the second to fourth inventions.

In embodiments of the first invention, when the Si amount exceeds 7 wt % and, for example, the metal circuit plate is Cu plate, Cu plate and Al brazing material are melted and mixed thereby to be easily alloyed. When the alloying phenomena is advanced, a brittle intermetallic compound is disadvantageously formed thereby to lower the bonding strength.

In contrast, in embodiments of the second and third inventions, since the insulating layer for preventing the Al brazing material layer and the metal circuit plate from being alloyed is provided, there is no problem even if Si is added to the Al brazing material with an Si content-range of 50 wt % or less. Further, the metal circuit plate and the insulating layer slightly exhibit the alloying phenomena. However, when at least one element selected from Ib, IIb, IIIb and IVb family elements such as Sn, In or the like prescribed in periodic table is used as a component for constituting the insulating layer, the alloying phenomena can be limited to a range of 10% or less of the thickness of the metal circuit plate.

Similarly in the fourth invention, since Al—Si circuit plate is directly bonded, there is no need of considering the alloying of the metal circuit plate to be separately provided. Therefore, Si amount of 50 wt % or less can be applied. When Si is added at amount of exceeding 50 wt %, Si is solely crystallized thereby to lower the bonding strength. Accordingly, in the second to fourth inventions, the Si amount contained in the Al brazing material or Al circuit plate is set to 50 wt % or less, preferably set to 15 wt % or less.

Further, in the first to fourth inventions, the Si amount is preferably set to at least 0.01 wt %. this is because when the amount is less than 0.01 wt %, the effect by the addition cannot be obtained. In addition, to maintain the eutectic bonding, it is preferable to set the Si amount to 0.05 wt % or more.

Accordingly, when summing up the Si contents contained in the Al brazing material or the metal circuit plate in respective cases, in the first invention, the Si amount is set to 0.01–7 wt %.

In the second invention, the Si amount is set to 0.01–50 wt %. In the third invention, the Si amount is set to 0.01–50 wt %. In the fourth invention, the Si amount is set to 0.01–50 wt %.

The more preferable ranges of Si amounts are 0.05–1 wt % for the first invention, 0.05–15 wt % for the second invention, 0.05–15 wt % for the third invention, 0.05–15 wt %, 0.05–15 wt % for the fourth invention. In addition, in a case where the alkaline earth metal or the compound thereof is added, the amount is preferably set to a range of 0.01–12 wt % or less.

In addition, various ceramic substrates such as silicon nitride, aluminum nitride, aluminum oxide or the like can be applied as the ceramic substrate. However, when the silicon nitride substrate is used in embodiments of the first to fourth inventions, the Si amount to be contained in the brazing material can be reduced to 7 wt % or less, preferably to 1 wt % or less. This is because Si contributing to the bonding is formerly contained in the silicon nitride substrate, so that Si is supplied to the bonding layer from a side of the silicon nitride substrate.

Further, in the ceramic circuit board according to another aspect of the present invention, it is preferable that the ceramic circuit board has a multi-layered structure in which at least two aluminum circuit plates are laminated through the silicon nitride substrate.

According to this structure, due to the laminated structure of the ceramic substrates and metal circuit plates laminated in a thickness direction of the circuit board, a plain surface area required for installing the circuit board can be reduced, so that a mounting space with respect to electronic devices can be reduced. In other word, the laminated structure can contribute to advance the miniaturization of the electronic devices. In addition, even in such a case, the effect of suppressing the crack formation to be caused at the silicon nitride substrate by the heat cycle is not impaired at all on the basis of the aforementioned respective structures. Accordingly, there can be exhibited an excellent effect in view of both increase of strength and reduction of the mounting space.

FIG. 6 shows an another preferable example of a structure of a ceramic circuit board according to the present invention.

The ceramic circuit board 1c of the present invention is formed, for example, by bonding aluminum plate 3 as a metal circuit plate to a ceramic substrate 2. When an outer peripheral portion of the aluminum plate 3 is symbolized as 3a and an inside the outer peripheral portion 3a is worked to form a thinned portion 3b, it becomes possible to suppress to cause crack to the ceramic substrate during manufacturing and operating the ceramic circuit board. In this regard, the inside the outer peripheral portion denotes an area having a constant width ranging from the outer peripheral portion toward a center portion of Al plate.

For example, the aluminum plate is directly bonded to the ceramic plate, the plates are heated up to a temperature higher than melting point of aluminum plate. However, when the thinned portion is formed to the inside the outer peripheral portion of the aluminum plate, a thermal stress caused at the outer peripheral portion of the aluminum plate is absorbed by the plastic deformation of the thinned portion formed to the aluminum plate, so that it becomes possible to suppress the crack formation to be caused at the ceramic plate.

In addition, not only a time when the aluminum plate and the ceramic substrate are bonded but also a time when the bonded circuit board is operated after the bonding operation, the thermal stress is caused by the heat cycle. However, in also this case, the thermal stress caused at the outer peripheral portion of the aluminum plate is absorbed by the plastic deformation of the thinned portion formed to the aluminum plate, so that it becomes possible to suppress the crack formation to be caused at the ceramic plate.

A shape of the thinned portion 3b may be formed, for example, as shown in FIG. 7. This thinned portion 3b is formed by grinding a surface of the aluminum plate to which the ceramic substrate is not bonded, thereby to form the thinned portion as a step portion. As a method of forming the thinned portion 3b, working methods such as etching treatment or the like can be used other than the mechanical working method.

The thinned portion 3b may be formed after the ceramic substrate and the aluminum plate are bonded. However, when the thinned portion 3b is previously formed before the ceramic substrate and the aluminum plate are bonded, the crack formation to the ceramic plate to be caused by the thermal stress at the bonding operation can be suppressed, thus being more effective.

A forming range of the thinned portion 3b is as follows. For example, assuming that a length from the outer peripheral portion of the aluminum plate to the thinned portion 3b is indicated as W and a thickness of the thinned portion 3b is indicated as T, the length W is preferably set to 0.3–1.0 mm and the thickness T is preferably set to $\frac{1}{6}$ to $\frac{5}{6}$ of a thickness at a mounting surface of the aluminum plate. When the length W from the outer peripheral portion to the thinned portion is less than 0.3 mm, a sufficient stress-mitigating effect cannot be obtained, so that the crack formation is liable to occur. Further, when the length W exceeds 1.0 mm, the stress-mitigating effect will be insufficient and a mounting surface of the aluminum plate to which electronic parts such as semiconductor chip, terminal or the like is mounted will be disadvantageously decreased. When the thickness T of the thinned portion 3b is less than $\frac{1}{6}$ of the aluminum plate at a mounting surface, there may be posed a fear that the strength of the aluminum plate is disadvantageously lowered. While, when the thickness T exceeds $\frac{5}{6}$ of the aluminum plate at the mounting surface, the stress-mitigating effect cannot be observed.

Next, another embodiment of the ceramic circuit board 1d according to the present invention is shown in FIG. 8.

As shown in FIG. 8, there is provided the ceramic circuit board 1d according to the present invention in which the aluminum plate 3 as metal circuit plate is provided with a plurality of holes 6 formed at inside an outer peripheral portion of a surface opposing to a bonding surface of the aluminum plate to which the ceramic substrate 2 is bonded.

As a more preferable embodiment of the aforementioned ceramic circuit board 1d, it is preferable that, for example, the plurality of holes 6 are linearly arranged along the outer peripheral portion of the aluminum plate 3a. A cross-sectional shape of the hole 6 may be a circular-shape as shown in FIG. 9 or may be a rectangular-shape as shown in FIG. 10. These a plurality of holes can be formed by etching treatment, or can be also formed by a pressing work using a pressing die. When the plurality of holes are formed to be linearly arranged, it is possible to effectively mitigate a stress-concentration applied to the outer peripheral portion of the aluminum plate.

Regarding to a size of the hole, in a case where the cross-sectional shape of the hole is circle as shown in FIG. 9 and a diameter of the hole is denoted as D, the diameter D is preferably set to 0.3 mm to 1.0 mm. In addition, when an interval between the adjacent holes is denoted as L, the interval L is preferably set to 0.3 mm to 1.0 mm. Further, when a distance from the outer peripheral portion of the metal plate to the hole is denoted as Z, the distance is preferably set to 0.3 mm or more.

When the diameter of the hole is less than 0.3 mm, the stress cannot be sufficiently mitigated. While, when the diameter of the hole exceeds 1.0 mm, the strength of the aluminum plate is lowered and the mounting surface area is disadvantageously decreased. Further, when the distance between the adjacent holes is excessively large, there may be a fear that a sufficient stress-mitigating effect cannot be obtained. While, when the distance is excessively small, there may be a case to cause a deformation of the aluminum plate. Furthermore, when the distance Z from the outer peripheral portion of the metal plate to the hole is less than 0.3 mm, there may be a fear that a sufficient stress-mitigating effect cannot be obtained.

The aforementioned plurality of holes can be formed as non-penetrated holes 6a as shown in FIGS. 11 and 12, or can be formed as penetrated holes 6b as shown in FIG. 13. For example, the non-penetrated hole 6a can be easily formed by the pressing work or the like, thus being effective in saving manufacturing man-hour. In addition, when the metal circuit plate and the ceramic substrate are bonded by applying DBA method (active metal brazing method), the penetrated hole 6b also functions as an exhaust hole through which gaseous components such as oxygen or the like exhausted at without contributing to the bonding operation can be exhausted.

In this connection, in a case where the plurality of holes are formed to be non-penetrated holes 6a, a shape of the hole 6a in the depth direction may be formed so as to have an uniform shape as shown in FIG. 11, or may be formed so as to have an inverse circular cone shape as shown in FIG. 12.

Next, another embodiment of the ceramic circuit board according to the present invention will be explained hereunder.

As shown in FIG. 14, there is provided the ceramic circuit board 1e according to the present invention in which an aluminum plate 3 as metal circuit plate is provided with a plurality of non-continuous grooves 7 that are provided along an outer peripheral portion of the metal circuit plate and formed at inside an outer peripheral portion of a surface opposing to a bonding surface of the aluminum plate 3 to which the ceramic substrate 2 is bonded. When such non-continuous grooves are provided to the aluminum plate 3, the stress caused at the outer peripheral portion of the aluminum plate 3 can be effectively mitigated. In this regard, the inside the outer peripheral portion means a portion having a constant width ranging from the outer peripheral portion toward a center portion of the metal circuit plate. In the ceramic circuit board of this invention, the non-continuous grooves are preferably formed and arranged in a linear-shape. When the non-continuous grooves are formed so as to have a linear-shape, the stress-concentration can be mitigated more effectively.

FIG. 15 shows a partially enlarged view of a part of the ceramic circuit board 1e according to the present invention. In FIG. 15, the reference character W' denotes a width of a single groove, E denotes a length of the single groove, and Z denotes a distance from the outer peripheral portion to the groove.

A shape of each single groove constituting the noncontinuous grooves is as follows. Namely, it is preferable that the width W' of the single groove is set to 0.05–1.0 mm, the length E is set to 20 mm or less and the distance Z from the outer peripheral portion to the groove is set to 0.3 mm or more.

When the width W' is less than 0.05 mm, the stress cannot be sufficiently mitigated. While, when the width W' exceeds 1.0 mm, the strength of the aluminum plate is lowered and the mounting area is also decreased. Further, when the length E of each single groove exceeds 20 mm, an area to which the grooves are not formed is decreased, so that there may be a fear that the deformation of the aluminum plate cannot be suppressed. Furthermore, when the distance Z from the outer peripheral portion to the groove is less than 0.3 mm, there may be a fear that a sufficient stress-mitigating effect cannot be obtained.

In this connection, a cross sectional shape in a longitudinal direction of the non-continuous groove 7 may be formed to make a groove 7a having a U-shaped in cross section as shown in FIG. 16, or may be formed to make a groove 7b having an inverse triangular shape as shown in FIG. 17. The depth H of the groove 7 is preferably set to 1/6 to 5/6 of a thickness at a mounting surface of the aluminum plate.

When the depth H is less than 1/6 of the thickness at the mounting surface of the aluminum plate, there may be a fear that the effect of dispersing the stress would be insufficient. While, when the depth H exceeds 5/6 of the thickness at the mounting surface of the aluminum plate, the strength of the aluminum plate is liable to be lowered.

As the ceramic substrate to be used for the ceramic circuit board of the present invention, it is preferable to use a substrate mainly composed of at least one material selected from alumina, aluminum nitride and silicon nitride.

BRIEF DESCRIPTION OF THE DRAWINGS

Other objects and aspects of the present invention will become more apparent from the following description of embodiments with reference to the accompanying drawings in which.

DETAILED DESCRIPTION OF THE PREFERRED EMBODIMENTS

Preferred embodiments of the present invention will be explained hereinafter on the basis of the following Examples and Comparative Examples.

EXAMPLE 1

Table 1: Sample No. 1–No. 15

Example 1 is explained with reference to Samples No. 1–No. 15 shown in Table 1. In Samples No. 1–No. 9, AlN substrates each having a thermal conductivity of 170 W/mK were used as ceramic substrate. While, in Samples No. 10–No. 15, $Si_3N_4$ substrates each having a thermal conductivity of 70 W/mK were used as ceramic substrate.

Brazing material pastes mainly composed of Al shown in Table 1 were screen printed on both surfaces of each of the ceramic substrates. Thereafter, Cu circuit plates or Al circuit plates as metal circuit plates were disposed on both surfaces of the printed ceramic substrate thereby to form respective laminates. Then, each of the laminates was heated in vacuum atmosphere up to a temperature of 650° C. so that the ceramic substrate and the metal circuit plate were bonded thereby to manufacture the respective ceramic circuit boards of Example 1.

Figure 1:
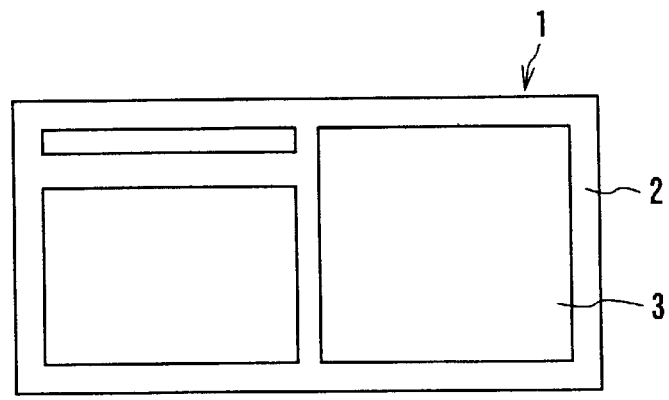
FIG. 1 is a plan view showing a structure of a ceramic circuit board according to one embodiment of the present invention.
Figure 2:
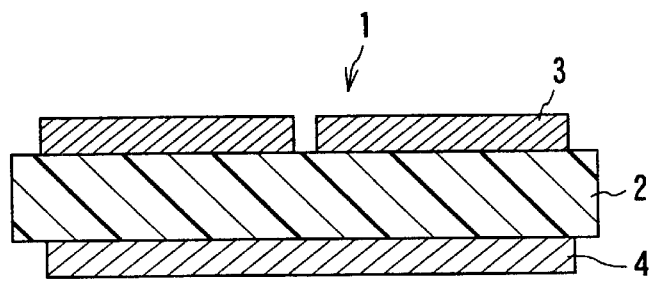
FIG. 2 is a cross sectional view of the ceramic circuit board shown in FIG. 1.
Figure 3:
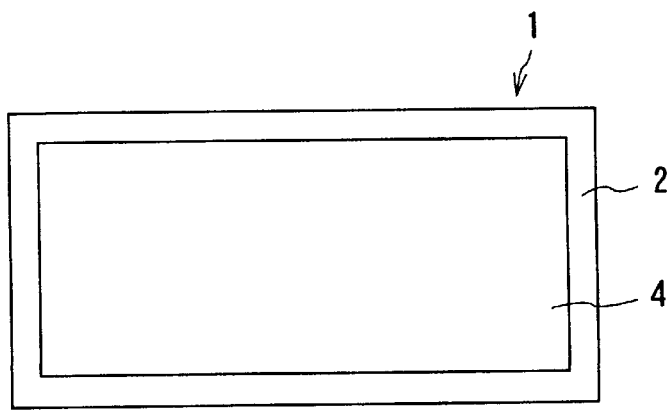
FIG. 3 is a rear end view of the ceramic circuit board shown in FIG. 1.

FIG. 1 is a plan view showing a ceramic circuit board 1 according to the respective Example 1, FIG. 2 is a cross sectional view of the ceramic circuit board 1 shown in FIG. 1 and FIG. 3 is a rear end view showing the ceramic circuit board 1 shown in FIG. 1.

FIG. 1 is a view showing a front pattern of the ceramic circuit board 1 in which Al circuit plate as metal circuit plate having a thickness of 0.3 mm was provided onto AlN substrates or $Si_3N_4$ substrates as ceramic substrate each having a thickness of 0.635 mm. Further, as shown in FIG. 2, Al circuit plates 3, 4 are bonded to both surfaces of the ceramic substrate 2 through a brazing material layer (not shown).

FIG. 3 is a view showing a rear (back) pattern of the ceramic circuit board 1 in which Al circuit plate having a thickness of 0.25 mm was provided onto AlN substrate or $Si_3N_4$ substrate. Note, in a case where Cu plate was used as the metal circuit plate, even if $Si_3N_4$ substrate was used as ceramic substrate, the size of the $Si_3N_4$ substrate was set to the same size as that of the AlN substrate.

Comparative Example 1

Table 1: Sample No. 16–No. 20

Comparative Example 1 is explained with reference to Samples No. 16–No. 20 shown in Table 1. In Samples No. 16, No.18 and No. 20, AlN substrates each having a thermal conductivity of 170 W/mK were used as ceramic substrate. While, in Samples No. 17 and No. 19, $Si_3N_4$ substrates having a thermal conductivity of 70 W/mK were used as ceramic substrate.

Brazing material pastes having a composition of Ag—Cu—Ti (Ti content: 2 wt %) or the like shown in Table 1 were screen printed on both upper and lower surfaces of each of the AlN substrate and $Si_3N_4$ substrate. Thereafter, Cu circuit plates as metal circuit plates were disposed on both surfaces of the printed ceramic substrate thereby to form respective laminates. Then, each of the laminates was heated in vacuum atmosphere up to a temperature of 850° C. so that the ceramic substrate and the metal circuit plate were bonded thereby to manufacture the respective ceramic circuit boards of Comparative Example 1.

With respect to thus manufactured ceramic circuit boards of Samples No.1–No.20 according to Example 1 and Comparative Example 1, heat cycle characteristic (resistance) and bonding strength (peel strength) of the metal circuit plate were evaluated. The evaluation was conducted by observing whether fine crack was caused or not in TCT (thermal cycle test) at stages when TCT cycle was repeated 500 cycles and 1000 cycles. Note, one TCT cycle was set to comprise the steps of: cooling the ceramic circuit board to a temperature of −40° C. and maintaining the ceramic circuit board for 30 min; heating the ceramic circuit board to a room temperature (RT) and maintaining the ceramic circuit board for 10 min; heating the ceramic circuit board to a temperature of +125° C. and maintaining the ceramic circuit board for 30 min; and cooling the ceramic circuit board to the room temperature (RT) and maintaining the ceramic circuit board for 10 min.

The confirmation of whether the fine crack was formed or not was conducted by the following method. Namely, with respect to each ceramic circuit boards after completion of TCT, the metal circuit plates were removed by an etching treatment, thereafter, a fluorescent penetrant inspection was applied to the respective ceramic substrates. In addition, the peel strength of the metal circuit plate after completion of TCT was measured. The results of the evaluation are shown in Table 1 hereunder.

TABLE 1

| | Sample No. | Ceramic Sub-strate | Bonding Layer Brazing Material Composition (wt %) | | | Metal Circuit Plate | Crack Formation TCT Cycle Number | | Bonding Strength (kgf/cm) TCT Cycle Number | |
|---|---|---|---|---|---|---|---|---|---|---|
| | | | Al | Si | Other | | 500 | 1000 | 500 | 1000 |
| Example 1 | 1 | AlN | Bal. | 6 | — | Cu | None | None | 12.4 | 11.9 |
| | 2 | AlN | Bal. | — | Cu (10) | Cu | None | None | 10.3 | 10.1 |
| | 3 | AlN | Bal. | — | Mg (10) | Cu | None | None | 14.6 | 13.3 |
| | 4 | AlN | Bal. | 3 | — | Cu | None | None | 13.8 | 13.4 |

TABLE 1-continued

| | Sample No. | Ceramic Substrate | Bonding Layer Brazing Material Composition (wt %) | | | Metal Circuit Plate | Crack Formation TCT Cycle Number | | Bonding Strength (kgf/cm) TCT Cycle Number | |
|---|---|---|---|---|---|---|---|---|---|---|
| | | | Al | Si | Other | | 500 | 1000 | 500 | 1000 |
| | 5 | AlN | Bal. | 1 | — | Cu | None | None | 14.9 | 14.6 |
| | 6 | AlN | Bal. | 0.1 | — | Cu | None | None | 15.4 | 15.2 |
| | 7 | AlN | Bal. | 0.05 | — | Cu | None | None | 15.8 | 15.7 |
| | 8 | AlN | Bal. | 0.05 | — | Al | None | None | 15.2 | 15.0 |
| | 9 | AlN | Bal. | 1 | — | Al | None | None | 14.3 | 13.9 |
| | 10 | $Si_3N_4$ | Bal. | 1 | — | Cu | None | None | 17.5 | 18.1 |
| | 11 | $Si_3N_4$ | Bal. | — | Ca (12) | Cu | None | None | 16.8 | 16.7 |
| | 12 | $Si_3N_4$ | Bal. | — | Mg (1) | Al | None | None | 13.9 | 13.2 |
| | 13 | $Si_3N_4$ | Bal. | — | Ca (1) | Al | None | None | 13.9 | 13.3 |
| | 14 | $Si_3N_4$ | Bal. | — | Sr (1) | Al | None | None | 13.7 | 13.2 |
| | 15 | $Si_3N_4$ | Bal. | — | Ba (1) | Al | None | None | 13.6 | 13.1 |
| Comparative Example 1 | 16 | AlN | | Ag—Cu—Ti | | Cu | Occurred | Occurred | 10.2 | 4.3 |
| | 17 | $Si_3N_4$ | | Ag—Cu—Ti | | Cu | None | Occurred | 12.5 | 5.5 |
| | 18 | AlN | Bal. | 20 | — | Cu | None | None | 9.8 | 6.5 |
| | 19 | $Si_3N_4$ | Bal. | — | Mg (20) | Cu | None | None | 10.2 | 6.8 |
| | 20 | AlN | Bal. | 0.001 | — | Cu | None | None | 4.8 | 4.3 |

When the observation for confirming whether the fine crack was formed or not was conducted, as is clear from the results shown in Table 1, a fine crack was not observed at all in Samples of Example 1, even after TCT cycle was repeated for 500 cycles and 1000 cycles. However, in Comparative Example 1, a fine crack was observed after TCT cycle was repeated for 1000 cycles.

As the results of measuring the peel strength, Example 1 could exhibit the peel strength of 10 kgf/cm or more in both case where TCT cycle was repeated for 500 cycles and a case where TCT cycle was repeated for 1000 cycles. Therefore, it was confirmed that a ceramic circuit board having a high heat-cycle resistance could be obtained. In particular, when the Al brazing material containing Si element was used, it was confirmed that Si amount was preferably set to 0.01–7 wt %, more preferably set to 0.05–2 wt %.

Further, above the same tendency can be observed in alkaline earth metals as well. An amount of a second component to be contained in the Al brazing material is preferably set to 12 wt % or less, more preferably set to 1 wt % or less. Even if the amount is set so as to exceed 12 wt %, the effect of improving the heat cycle resistance and peel strength is saturated and further improvement cannot be expected. On the other hand, when the amount is less than 0.01 wt %, the effect per se can be hardly obtained and the bonding strengths disadvantageously became less than 7 kg/cm. Among the various addition elements, Si is the most effective element. This reason is considered that Si can easily form an eutectic compound together with Al. This tendency was similarly observed in both cases where Al plate and Cu plate were used as the metal circuit plate.

In Samples No.16 and 17 in Comparative Example 1, Ag—Cu—Ti was used as the brazing material. That is, the ceramic substrate and the Cu circuit plate were bonded by the conventional active metal brazing method, so that the both members were firmly bonded and a residual stress was increased whereby the thermal stress caused at the subsequent thermal load cycle was disadvantageously increased.

On the other hand, in Example 1, the brazing material mainly composed of Al as a soft metal having a yield stress of 20 MPa or less was used, so that the residual stress caused by a difference in linear expansion coefficients between the ceramic substrate and the Cu circuit plate could be reduced. Further, the thermal stress caused by the heat load cycle could also reduced, so that the crack due to the thermal stress was hardly caused whereby a bonding strength between the ceramic substrate and the Cu circuit plate could be remarkably improved.

In contrast, in the ceramic circuit boards of Samples No. 18, No. 19 and No. 20 in which the amount of Si or alkaline earth metal element contained in the brazing materials were set to be excessively large or excessively small, it was confirmed that the bonding strength was disadvantageously lowered. This is because that Al brazing material and the metal circuit plate were alloyed, so that a large amount of brittle intermetallic compound were formed to a portion having a range in a thickness direction corresponding to 40% of the thickness of the metal circuit plate, which clearly exceeded 10% of the thickness of the metal circuit plate.

EXAMPLE 2

Table 2: Sample No. 21–No. 31

Example 2 is explained with reference to Samples No. 21–No. 31 shown in Table 2. In Samples No. 21–No. 25, No. 28–No. 31, AlN substrates manufactured in the same sintering lot each having a thermal conductivity of 170 W/mK were used as ceramic substrate. While, in Sample No. 26, $Si_3N_4$ substrate having a thermal conductivity of 70 W/mK was used as ceramic substrate. In Sample No. 27, $Al_2O_3$ substrate was used as ceramic substrate.

Al—Si brazing material paste mainly composed of Al and containing 0.1–2 wt % of Si shown in Table 2 was screen-printed on both upper and lower surfaces of each of the ceramic substrates.

Thereafter, Ag foil, Zn foil, In foil, Sn foil and Ni foil each having a thickness of 50 μm as shown in table 2 were disposed on the printed surfaces thereby to form respective insulating layers. Note, in Sample No. 29, after the Al—Si brazing material paste was screen-printed, an Sn paste containing Sn powder having an average grain size of 10 μm was screen-printed onto the printed brazing material thereby to form an insulating layer. In addition, in Sample No. 30, the insulating layer was formed by disposing Ag foil having a thickness of 5 µm. Further, in Sample No. 31, the insulating layer was formed by using Sn brazing paste containing Sn powder having an average grain size of 20 µm.

Thereafter, Cu circuit plates or Ni circuit plate as metal circuit plates were disposed on the surface of the printed ceramic substrate through the insulating layer thereby to form respective laminates. Then, each of the laminates was heated in vacuum atmosphere up to a temperature of 650° C. so that the ceramic substrate and the metal circuit plates such as Cu circuit plate and Ni circuit plate were bonded thereby to manufacture the respective ceramic circuit boards of the respective Samples.

A front pattern of the ceramic circuit board was formed by Cu plate having a thickness of 0.3 mm which was bonded onto the Si$_3$N$_4$ substrate. While, a rear pattern of the ceramic circuit board was formed by Cu plate having a thickness of 0.25 mm which was bonded onto the Si$_3$N$_4$ substrate.

Comparative Example 2

Table 2: Samples No. 32 and No. 33

Comparative Example 2 is explained with reference to Samples No. 32 and No. 33 shown in Table 2. In Samples No. 32, AlN substrate having a thermal conductivity of 170 W/mK was used as ceramic substrate. While, in Samples No. 33, Si$_3$N$_4$ substrate having a thermal conductivity of 70 W/mK was used as ceramic substrate.

In Samples No. 32 and No. 33, a brazing material paste having a composition of Ag—Cu—Ti (Ti content: 2.5 wt %) shown in Table 2 was screen-printed onto both upper and lower surfaces of each of the AlN substrate and Si$_3$N$_4$ substrate. Thereafter, Cu circuit plates as metal circuit plates were disposed on both surfaces of the printed ceramic substrate thereby to form respective laminates. Then, each of the laminates was heated in vacuum atmosphere up to a temperature of 850° so that the ceramic substrate and the Cu circuit plate were bonded thereby to manufacture the respective ceramic circuit boards of Comparative Example 2.

With respect to thus manufactured ceramic circuit boards of Samples No. 21–No. 33 according to Example 2 and Comparative Example 2, heat cycle characteristic (resistance) and bonding strength (peel strength) of the metal circuit plate were evaluated. The evaluation was conducted by measuring the bonding strength (peel strength) of the metal circuit plate and by observing whether fine crack was caused or not in TCT (thermal cycle test) at stages when TCT cycle was repeated 500 cycles and 1000 cycles. Note, the TCT conditions such as temperature and maintaining time were set to the same as in Example 1. The results of the evaluation are shown in Table 2 hereunder.

TABLE 2

| | Sample No. | Ceramic Sub-strate | Bonding Layer Brazing Material Composition (wt %) | Insulating Layer Kind | Insulating Layer Thickness or Average Grain Size | Metal Circuit Plate | Crack Formation TCT Cycle Number 500 | Crack Formation TCT Cycle Number 1000 | Bonding Strength (kgf/cm) TCT Cycle Number 500 | Bonding Strength (kgf/cm) TCT Cycle Number 1000 |
|---|---|---|---|---|---|---|---|---|---|---|
| Example 2 | 21 | AlN | Al (Bal.) Si (0.05) | Ag foil | Thickness 50 µm | Cu | None | None | 19.2 | 17.5 |
| | 22 | AlN | Al (Bal.) Si (2) | Zn foil | Thickness 50 µm | Cu | None | None | 17.3 | 18.0 |
| | 23 | AlN | Al (Bal.) Si (0.05) | In foil | Thickness 50 µm | Cu | None | None | 19.2 | 19.2 |
| | 24 | AlN | Al (Bal.) Si (0.05) | Sn foil | Thickness 50 µm | Cu | None | None | 17.7 | 17.9 |
| | 25 | AlN | Al (Bal.) Si (0.05) | Sn foil | Thickness 50 µm | Ni | None | None | 15.0 | 15.4 |
| | 26 | Si$_3$N$_4$ | Al (Bal.) Si (0.05) | Sn foil | Thickness 50 µm | Cu | None | None | 20.3 | 21.7 |
| | 27 | Al$_2$O$_3$ | Al (Bal.) Si (0.05) | Sn foil | Thickness 50 µm | Cu | None | None | 15.4 | 13.9 |
| | 28 | AlN | Al (Bal.) Si (0.1) | Ni foil | Thickness 50 µm | Cu | None | None | 14.1 | 13.5 |
| | 29 | AlN | Al (Bal.) Si (0.05) | Sn Paste | Average Grain Size 10 µm | Cu | None | None | 13.2 | 13.0 |
| | 30 | AlN | Al (Bal.) Si (0.05) | Ag foil | Thickness 5 µm | Cu | None | None | 18.1 | 16.9 |
| | 31 | AlN | Al (Bal.) Si (0.05) | Sn Paste | Average Grain Size 20 µm | Cu | None | None | 12.8 | 12.2 |
| Comparative Example 2 | 32 | AlN | Ag—Cu—Ti | — | — | Cu | Occurred | Occurred | 10.2 | 4.3 |
| | 33 | Si$_3$N$_4$ | Ag—Cu—Ti | — | — | Cu | None | Occurred | 12.5 | 5.5 |

When the observation for confirming whether the fine crack was formed or not was conducted, as is clear from the results shown in Table 2, a fine crack was not observed at all in Samples of Example 2, even after TCT cycle was repeated for 500 cycles and 1000 cycles. However, in Comparative Example 2, a fine crack was observed after TCT cycle was repeated for 1000 cycles.

As the results of measuring the peel strength, Samples of Example 2 could exhibit the peel strength of 12.0 kgf/cm or more in both cases where TCT cycle was repeated for 500 cycles and where TCT cycle was repeated for 1000 cycles. Therefore, it was confirmed that the bonding strengths of Example 2 could remarkably improved in comparison with those of Comparative Example 2.

In Example 2, Cu circuit plate is used as the metal circuit plate, and the insulating layer (metal foil such as Ag foil, Zn foil or the like) composed of at least one element selected from Ib, IIb, IIIb, IVb family elements prescribed in periodic table is provided between the bonding layer composed of the brazing material and the metal circuit plate, Al component contained in the brazing material and Cu component contained in the metal circuit plate could be prevented from being alloyed whereby the bonding strength between the ceramic substrate and the metal circuit plate could be maintained to be high.

Further, as is clear from the comparison of Sample No. 21 with Sample No. 30 in which the same metal foils (Ag foils) are used as the insulating layers, when the thickness of the Ag foil is less than 10 µm, the bonding strength is somewhat lowered. This reason is considered that the effect of preventing the Al type brazing material and the Cu plate from being alloyed is lowered when the thickness of the insulating layer becomes less than 10 µm.

Similarly, when Sample No. 29 is compared with Sample No. 31 in which the same Sn powder pastes are used as the insulating layers, Sample No. 31 in which metal powder constituting the insulating layer having a larger average grain size has somewhat lower bonding strength in comparison with that of Sample No. 29. This reason is considered that a density of the insulating layer is not sufficient and the effect of preventing the Al type brazing material and the Cu circuit plate from being alloyed becomes insufficient.

EXAMPLE 3

Table 3: Sample No. 34–No. 39

Example 3 is explained with reference to Samples No. 34–No. 39 shown in Table 3. In Samples No. 34–No. 36 and No. 38, AlN substrates manufactured in the same sintering lot each having a thermal conductivity of 170 W/mK were used as ceramic substrate.

While, in Samples No. 37 and No. 39, $Si_3N_4$ substrates each having a thermal conductivity of 70 W/mK were used as ceramic substrates.

In Samples No. 34–No. 37, a brazing material paste mainly composed of Al and containing Si powder having an average grain size of 10 μm shown in Table 3 was screen-printed on both upper and lower surfaces of each of the ceramic substrates thereby to form a first bonding layer.

Thereafter, Ni foil, In foil and Sn foil each having a thickness of 30 μm as shown in table 3 were disposed on the printed surfaces thereby to form respective insulating layers. In addition, the brazing material paste mainly composed of Al shown in Table 3 was again screen-printed onto the insulating layers thereby to form a second bonding layer. Thereafter, Cu circuit plates were disposed on the second bonding layer.

On the other hand, in Samples No. 38 and No. 39, an Al—Si alloy mainly composed of Al and containing Si shown in Table 3 was provided on surface of each of the ceramic substrates thereby to form a first bonding layer.

Thereafter, Ni foil having a thickness of 50 μm was disposed on the first bonding layer thereby to form respective insulating layers. In addition, the Al—Si alloy mainly composed of Al and containing Si was provided onto the insulating layers thereby to form a second bonding layer. Thereafter, Cu circuit plates were disposed on the second bonding layer thereby to prepare the respective laminates.

Thereafter, each of the laminates of Sample No. 34–No. 39 was heated in vacuum atmosphere up to a temperature of 650° C. so that the ceramic substrate and the Cu circuit plate were bonded thereby to manufacture the respective ceramic circuit boards of Example 3.

Comparative Example 3

Table 3: Samples No. 40 and No. 41

Comparative Example 3 is explained with reference to Samples No. 40 and No. 41 shown in Table 3. Samples in Comparative Example 3 were manufactured by the following manner in which only the first bonding layer formed in Example 3 was formed and the second bonding layer was not formed.

That is, in Samples No. 40, AlN substrate having a thermal conductivity of 170 W/mK was used as ceramic substrate. While, in Samples No. 41, $Si_3N_4$ substrate having a thermal conductivity of 70 W/mK was used as ceramic substrate.

In Samples No. 40 and No. 41, an Al—Si brazing material paste mainly composed of Al and containing Si as shown in Table 3 was screen-printed onto surfaces of each of the AlN substrate and $Si_3N_4$ substrate thereby to form a first bonding layer. Then, Ni foil having a thickness of 5 μm was disposed on the printed surface thereby to form an insulating layer. Thereafter, Cu circuit plates as metal circuit plates were disposed on the insulating layer thereby to form respective laminates. Then, each of the laminates was heated in vacuum atmosphere up to a temperature of 65° C. so that the ceramic substrate and the Cu circuit plate were bonded thereby to manufacture the respective ceramic circuit boards of Comparative Example 3.

With respect to thus manufactured ceramic circuit boards of Samples according to Example 3 and Comparative Example 3, heat cycle characteristic (resistance) and bonding strength (peel strength) of the metal circuit plate were evaluated. The evaluation was conducted by measuring the bonding strength (peel strength) of Cu circuit plate and by observing whether fine crack was caused or not in TCT (thermal cycle test) at stages when TCT cycle was repeated 500 cycles and 1000 cycles. Note, the TCT conditions such as temperature and maintaining time were set to the same as in Example 1. The results of the evaluation are shown in Table 3 hereunder.

TABLE 3

| | Sample No. | Ceramic Substrate | First Bonding Layer Composition of Brazing Material or Alloy Layer (wt %) | Insulating Layer | Second Bonding Layer Composition of Brazing Material or Alloy Layer (wt %) | Metal Circuit Plate | Crack Formation TCT Cycle Number | | Bonding Strength (kgf/cm) TCT Cycle Number | |
|---|---|---|---|---|---|---|---|---|---|---|
| | | | | | | | 500 | 1000 | 500 | 1000 |
| Example 3 | 34 | AlN | Brazing Material Al (Bal.) Si (0.05) | Ni foil | Brazing Material Al (Bal.) Si (1) | Cu | None | None | 15.4 | 14.1 |
| | 35 | AlN | Brazing Material Al (Bal.) Si (0.06) | In foil | Brazing Material Al (Bal.) Si (12) | Cu | None | None | 13.9 | 13.2 |
| | 36 | AlN | Brazing Material Al (Bal.) Si (0.07) | Sn foil | Brazing Material Al (Bal.) Si (12) | Cu | None | None | 14.2 | 13.6 |
| | 37 | $Si_3N_4$ | Brazing Material Al (Bal.) Si (0.08) | Ni foil | Brazing Material Al (Bal.) Si (12) | Cu | None | None | 20.4 | 20.0 |
| | 38 | AlN | Alloy Layer Al (Bal) Si (0.05) | Ni foil | Alloy Layer Al (Bal.) Si (12) | Cu | None | None | 15.0 | 14.7 |
| | 39 | $Si_3N_4$ | Alloy Layer Al (Bal.) Si (0.05) | Ni foil | Alloy Layer Al (Bal.) Si (0.1) | Cu | None | None | 19.8 | 18.8 |

TABLE 3-continued

| | Sample No. | Ceramic Substrate | First Bonding Layer Composition of Brazing Material or Alloy Layer (wt %) | Insulating Layer | Second Bonding Layer Composition of Brazing Material or Alloy Layer (wt %) | Metal Circuit Plate | Crack Formation TCT Cycle Number 500 | 1000 | Bonding Strength (kgf/cm) TCT Cycle Number 500 | 1000 |
|---|---|---|---|---|---|---|---|---|---|---|
| Comparative Example 3 | 40 | AlN | Brazing Material Al (Bal.) Si (1.0) | Ni foil | — | Cu | None | Occurred | 8.8 | 4.7 |
| | 41 | $Si_3N_4$ | Brazing Material Al (Bal.) Si (1.0) | Ni foil | — | Cu | None | None | 9.4 | 6.6 |

When the observation for confirming whether the fine crack was formed or not was conducted, as is clear from the results shown in Table 3, a fine crack was not observed at all in Samples of Example 2, even after TCT cycle was repeated for 500 cycles and 1000 cycles. However, in Samples of Comparative Example 3, a fine crack was observed after TCT cycle was repeated for 1000 cycles.

As the results of measuring the peel strength, as shown in table 3, even in Samples of Comparative Example 3, since the insulating layers were provided, Al component contained in the brazing material and Cu component in the metal circuit plate were prevented from being alloyed thereby to prevent the crack formation. In addition, the boding strength between the ceramic substrate and the Cu circuit plate could be increased.

Further, in Example 3, since the second bonding layer mainly composed of soft metals such as Al or the like is provided on the insulating layer, Samples of Example 3 can exhibit the peel strength of 10 kgf/cm or more in both case where TCT cycle was repeated for 500 cycles and a case where TCT cycle was repeated for 1000 cycles. Therefore, it was confirmed that the bonding strengths of Example 3 could remarkably improved in comparison with those of Comparative Example 3. In addition, though not shown in Table 3, influences of changes in the thickness of the Al group brazing material and the thickness of the insulating layer or the like exhibited almost the same tendency as in Example 2.

Therefore, according to the present Example, the metal circuit plate is bonded to the ceramic substrate through the bonding layer mainly composed of Al as soft metal and through the insulating layer composed of at least one element selected from Ib, IIb, IIIb, IVb, VIIIb family elements prescribed in periodic table thereby to prepare the ceramic circuit board, so that the crack formation can be prevented, and a high bonding strength can be maintained even if the thermal load is applied to the circuit board for a long time.

In addition, when a plurality of bonding layers each composed of brazing material are laminated as like this Example, the thermal stress to be caused by the thermal load cycle can be reduced in comparison with a case where the bonding layer is formed as a single layer. Therefore, the crack due to the thermal stress hardly occur, and the boding strength between the ceramic substrate and the Cu circuit plate can be improved.

As described above, according to the ceramic circuit board of Examples, there can be provided a ceramic circuit board having both high heat cycle resistance and high bonding strength, and capable of improving operating reliability as an electronic device.

Next, another preferred embodiment of the present invention in which high thermal conductive silicon nitride substrate is used as a ceramic substrate and aluminum circuit plate is used as a metal circuit plate will be explained hereunder with reference to FIGS. 4 and 5.

EXAMPLE 4–9 and Comparative Example 4–5

Figure 4:
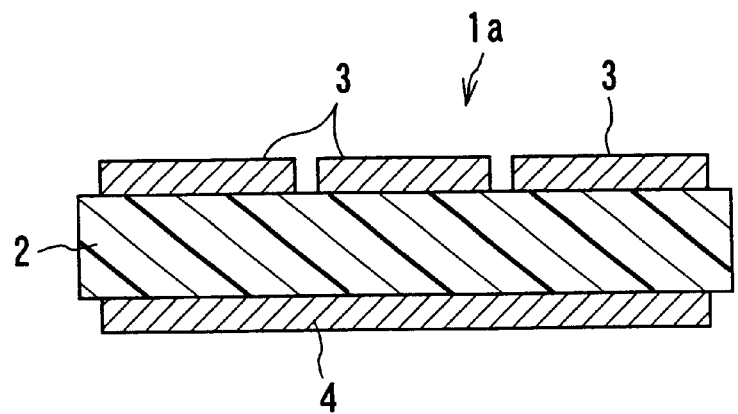
FIG. 4 is a cross sectional view showing a structure of a ceramic circuit board having a single-layered structure according to another embodiment of the present invention.

FIG. 4 is a cross sectional view showing a structure of a ceramic circuit board 1a having a single layered structure. As shown in this FIG. 4, the ceramic circuit board 1a according to one embodiment of the present invention has a single layered structure in which aluminum circuit plates 3, 4 are bonded to both surfaces of a silicon nitride substrate 2.

When the silicon nitride substrate 2 is prepared, at first, sintering agent such as rare earth oxide powder, hafnia powder, alumina powder or the like is added to silicon nitride material powder and uniformly mixed thereby to prepare a material mixed powder. As the silicon nitride material powder as a starting material, it is preferable to use fine silicon nitride powder having an average grain size of 5 μm or less. When the silicon nitride powder having such a fine particle-shape, there can be obtained a high thermal conductive silicon nitride sintered body i.e. the silicon nitride substrate 2 having a high density and excellent in mechanical characteristics. Incidentally, it is more preferable that the average grain size of the silicon nitride powder is 1 μm or less, and 0.5 μm or less is particularly preferable.

Examples of the rare earth element oxide to be added as the sintering agent may include oxides of Y, La, Sc, Pr, Ce, Nd, Dy, Gd, Er or the like and substances that are converted into oxide at a time of sintering operation. Hf oxide can be also available. These sintering agents are contained as a single substance or as a composite sintering agent prepared by combining at least two substances. Yttrium oxide ($Y_2O_3$) is particularly preferable. These sintering agents react with silicon nitride powder to generate a liquid phase which functions as a sintering promoting agent.

An addition amount of the sintering agent is preferably set to a range of 2–17.5 wt % calculated as oxide thereof with respect to the silicon nitride powder. When the addition amount is less than 2 wt %, the resulting sintered body cannot be densified, thus resulting in a silicon nitride sintered body having a low strength and a low thermal conductivity. On the other hand, when the addition amount exceeds 17.5 wt %, an excessive amount of grain boundary phase is formed, so that thermal conductivity and strength are started to be lowered. The range of 5–12 wt % is particularly preferable.

Further, alumina ($Al_2O_3$) as another additive component plays a role of promoting the function of above rare earth elements as the sintering agent. When the addition amount of alumina as aluminum source is less than 0.5 wt %, the densification will become insufficient. On the other hand, when the amount exceeds 2 wt %, an excessive amount of grain boundary phase is formed and alumina starts to dissolve into silicon nitride in a solid-state, so that thermal conductivity starts to be lowered. Therefore, it is preferable that the addition amount of alumina is set to a range of 0.5–2.0 wt %.

In particular, in order to secure good characteristics as well as strength and thermal conductivity, the addition amount of alumina is preferably set to a range of 0.7–1.5 wt %. When magnesium oxide (MgO) or hafnium oxide ($HfO_2$) or the like are added at amount of 0.1–2 wt %, an improvement in strength and sintering property can also be observed. In addition, when the sintered body after completion of the sintering operation is moderately cooled at a cooling speed of 100° C./hour or less as required, the grain boundaries can be crystallized, so that the thermal conductivity of the silicon nitride sintered body can be increased. The ratio of the crystallized grain boundary phase to entire grain boundary phase is set to 20% or more, preferably set to 50% or more.

Further, for the purpose of preventing carbon content from remaining in a molded body of silicon nitride material powder after a degreasing operation, tantalum oxide, niobium oxide, titanium oxide, tungsten oxide or the like may be added to the above silicon nitride material powder for making the sintered body. In this connection, other impurity cationic ion elements such as Li, Na, K, Fe, Ca, Sr, Ba, Mn, B or the like inhibit the thermal conductivity of the silicon nitride sintered body.

Therefore, in order to secure a high thermal conductivity of 50 W/mK or more, an amount of the above impurity cationic ion elements is preferably set to 0.3 wt % or less in a total amount.

An organic binder and organic solvent are added to the above silicon nitride material mixed powder, and uniformly mixed thereby to prepare a slurry. Then, the slurry is molded to form a sheet-shaped molded body in accordance with an ordinal molding methods such as a Doctor-blade method or the like thereby to prepare a silicon nitride green sheet. Subsequently, the silicon nitride green sheet is subjected to a degreasing treatment in non-oxidizing atmospheres such as air atmosphere or nitrogen gas atmosphere or the like. Thereafter, the degreased green sheet is sintered in a non-oxidizing atmosphere such as nitrogen gas atmosphere thereby to prepare the silicon nitride substrate 2.

Then, Al—Si alloy plates 3, 4 as aluminum circuit plates were directly bonded to thus prepared silicon nitride substrate 2 without providing a brazing layer in accordance with DBA (direct bonding aluminum) method thereby to manufacture ceramic circuit boards of Examples 4–9. In this case, Si contents in the Al—Si alloy plates were variously changed as shown in Table 4.

Table 4 shows peel strengths of the ceramic circuit boards of Examples 4–9 at before and after the thermal cycle test (TCT) was conducted. One cycle of TCT comprises the step of: cooling the circuit board to a temperature of −40° C. and maintaining it for 30 minutes; heating the circuit board to a room temperature (RT) and maintaining it for 10 minutes; heating the circuit board to a temperature of +125 ° C. and maintaining it for 30 minutes; and cooling the circuit board to RT and maintaining it for 10 minutes. Such one cycle was repeated 1000 times. In addition, Comparative Example 4, in which the metal circuit plate was changed to copper plate, was manufactured by active metal brazing method using Ag—Cu—Ti (Ti: 2 wt %) brazing material. Further, Comparative Example 5 was manufactured by the direct bonding copper (DBC) method. Data of Comparative Examples 4 and 5 are also indicated in Table 4 hereunder.

TABLE 4

|  | Bonding Method | Brazing Material | Si Amount (wt %) Al Circuit Plate | Peel Strength Before TCT (kg/cm) | Peel Strength After TCT of 1000 Cycles (kg/cm) |
| --- | --- | --- | --- | --- | --- |
| Example 4 | Direct Bonding | — | 20 | 16.2 | 15.5 |
| Example 5 | Direct Bonding | — | 10 | 17.1 | 16.6 |
| Example 6 | Direct Bonding | — | 1.5 | 18.0 | 17.8 |
| Example 7 | Direct Bonding | — | 0.1 | 18.1 | 17.8 |
| Example 8 | Direct Bonding | — | 0.05 | 17.3 | 16.9 |
| Example 9 | Direct Bonding | — | 0.01 | 16.8 | 16.4 |
| Comparative Example 4 | Active Metal Brazing | Ag—Cu—Ti Brazing Material | | 12.1 | 5.8 |
| Comparative Example 5 | Direct Bonding Copper | — | | 10.3 | 2.5 |

As shown in Table 4, it was confirmed that the peel strengths of the ceramic circuit boards of Examples 4–9 after the bonding operation were not greatly changed. However, when compared the strengths after 1000 cycles of TCT, Examples of the present invention were confirmed to be more excellent. In particular, the peel strengths of Comparative Examples were greatly lowered after TCT was conducted. Therefore, it can be said that Comparative Examples are difficult to be applied to objects such as a recent power-transistor module or the like generating a large amount of heat.

In addition, as is clear from Table 4, when the Si amount contained in the Al—Si alloy plates are set to 0.01 . 50 wt %, more preferably to 0.05–2 wt %, it was confirmed that more preferable results could be obtained.

As described above, according to the present Examples, when the heat cycle is applied to the ceramic circuit board, the effect of suppressing the crack to be formed to the silicon nitride substrate 2 can be greatly increased. Therefore, due to the effect, an availability particularly in durability of the ceramic circuit board can be greatly increased.

Figure 5:
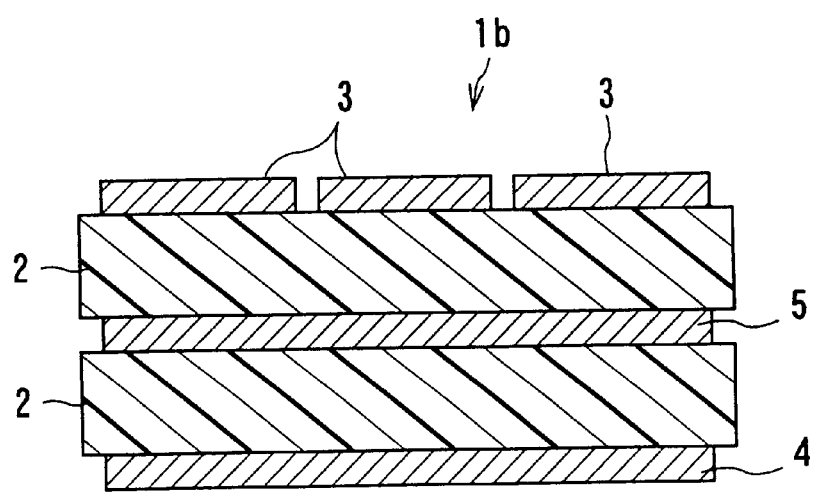
FIG. 5 is a cross sectional view showing a structure of a ceramic circuit board having a multi-layered structure according to still another embodiment of the present invention.
Figure 6:
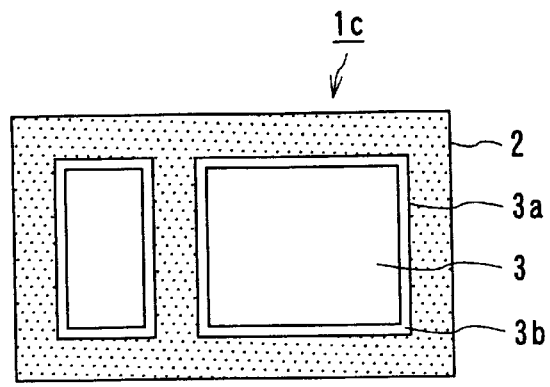
FIG. 6 is a plan view showing one embodiment of a ceramic circuit board in which a thinned portion is provided to inside the outer peripheral portion of a metal circuit plate.
Figure 7:
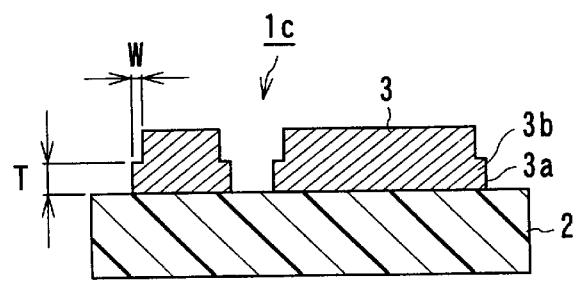
FIG. 7 is a cross sectional view showing one embodiment of a ceramic circuit board in which a thinned portion is provided to an inside the outer peripheral portion of a metal circuit plate.
Figure 8:
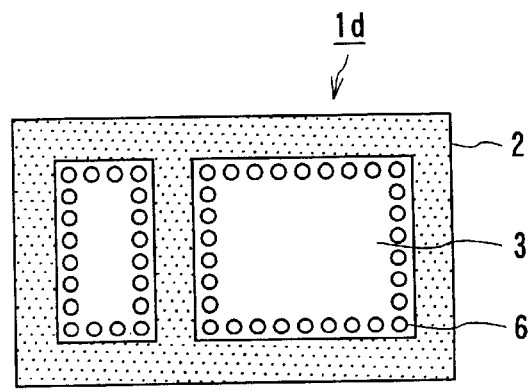
FIG. 8 is a plan view showing another embodiment of a ceramic circuit board in which holes are provided to inside the outer peripheral portion of a metal circuit plate.
Figure 9:
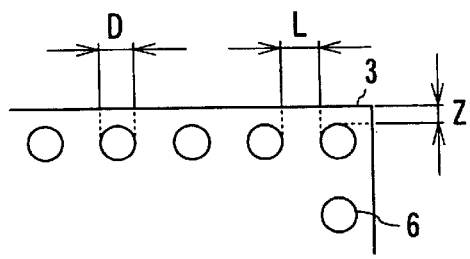
FIG. 9 is an enlarged partially plan view showing a part of the metal circuit plate shown in FIG. 8.
Figure 10:
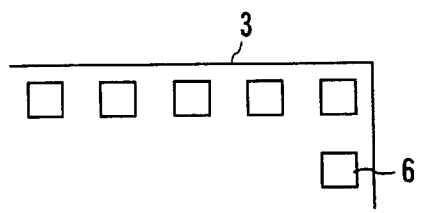
FIG. 10 is a plan view showing one embodiment of a ceramic circuit board in which holes are formed to have rectangular-shape.
Figure 11:
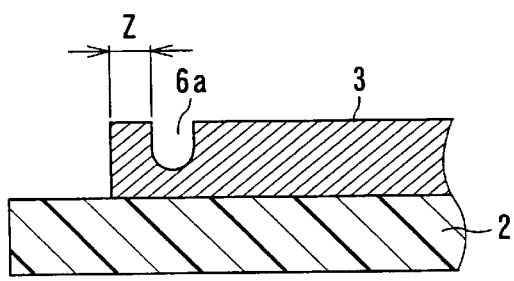
FIG. 11 is a cross sectional view showing another embodiment of a ceramic circuit board in which holes are provided to inside the outer peripheral portion of a metal circuit plate.
Figure 12:
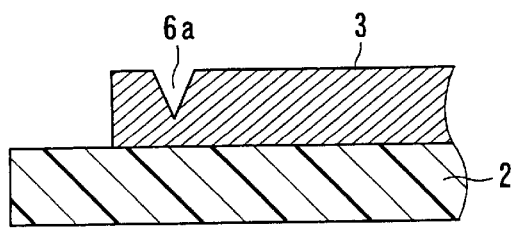
FIG. 12 is a cross sectional view showing another sample of a shape of the hole in a depth direction.
Figure 13:
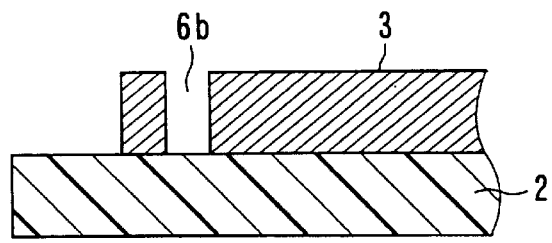
FIG. 13 is a cross sectional view showing one embodiment of a ceramic circuit board in which holes are formed to be penetrated holes.
Figure 14:
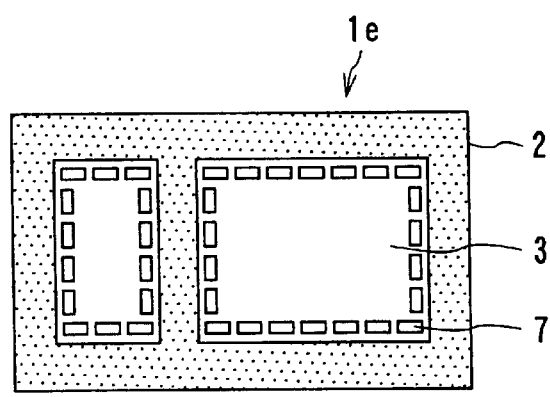
FIG. 14 is a plan view showing one embodiment of a ceramic circuit board in which non-continuous grooves are provided to inside the outer peripheral portion of a metal circuit plate.
Figure 15:
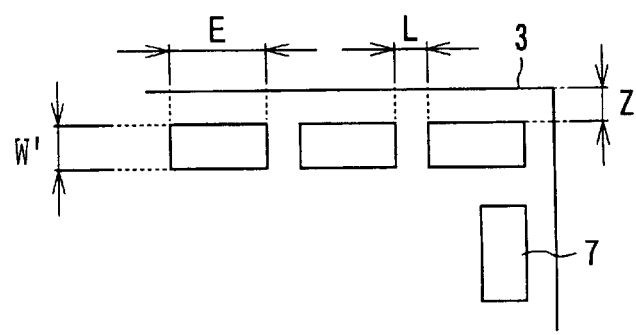
FIG. 15 is an enlarged partially plan view showing a part of the metal circuit plate shown in FIG. 14.
Figure 16:
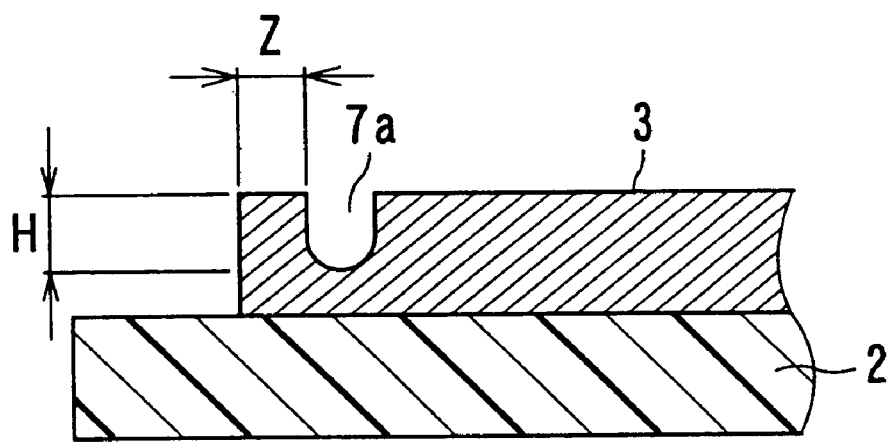
FIG. 16 is a cross sectional view showing one sample of a cross sectional shape of the groove.
Figure 17:
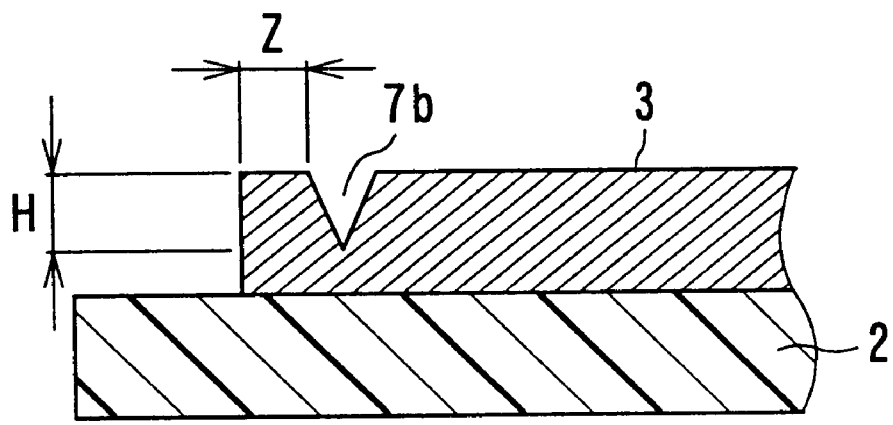
FIG. 17 is a cross sectional view showing another sample of a cross sectional shape of the groove.

FIG. 5 is a cross sectional view showing another Example of a ceramic circuit board 1b having a multi-layered structure. As shown in FIG. 5, the ceramic circuit board 1b is manufactured so that two layers of silicon nitride substrates 2, 2 are bonded through an aluminum circuit plate 5, and aluminum circuit plates 3, 4 are bonded onto outer side surface of each silicon nitride substrates 2, 2. A bonding structure shown in FIG. 5 is the same as that in FIG. 4.

In also this structure, the same results in strength could be obtained. Further, in this case, such laminating structure (multi-layered structure) can contribute to reduce the mounting space for mounting the circuit board to devices. In addition, even in this case, the effect of suppressing the crack to be caused in the silicon nitride substrate due to the heat cycle are not lost.

As described above, according to Examples of this invention, there can be provided a high availability in preventing the crack formation to be caused by a fastening operation for the ceramic circuit board at the assembling process. In addition, when the heat cycle is applied to the ceramic circuit board, the effect of suppressing the crack to be formed to the silicon nitride substrate can be greatly increased. Therefore, due to the suppressing effect, an availability particularly in durability of the ceramic circuit board can be greatly increased.

Further, the structure can contribute to reduce the mounting space for mounting the circuit board to devices, and even in this case, the effect of suppressing the crack to be caused in the silicon nitride substrate due to the heat cycle are not deteriorated, so that there can be provided excellent effects in view of both miniaturization and strength.

Next, Examples of ceramic circuit boards in which a thinned portion, holes or grooves are formed to outer peripheral portion of the metal circuit plates will be explained hereunder.

EXAMPLE 10

Figure 18:
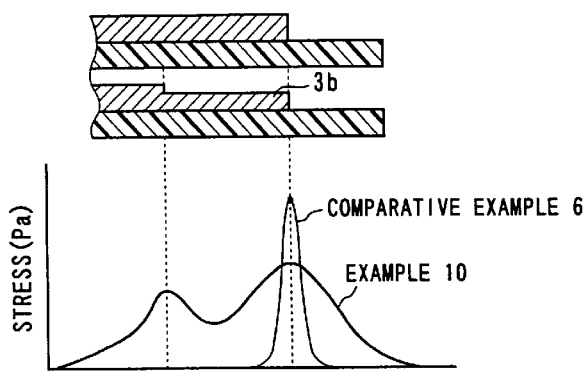
FIG. 18 is a view showing a stress distribution in a ceramic circuit board of Example 10 after the ceramic circuit board was subjected to thermal cycle test (TCT)

Aluminum plate having a thickness of 0.5 mm and a purity of 99% or more was prepared. Then, the aluminum plate was subjected to an etching treatment so that a thickness of a portion having a width of 1 mm from outer periphery of the aluminum plate was reduced to 0.25 mm thereby to form a thinned portion 3b as shown in FIG. 18. Thereafter, thus etched aluminum plate was directly bonded to an aluminum nitride substrate having a thickness of 0.7 mm thereby to manufacture a ceramic circuit board of Example 10.

EXAMPLE 11

Figure 19:
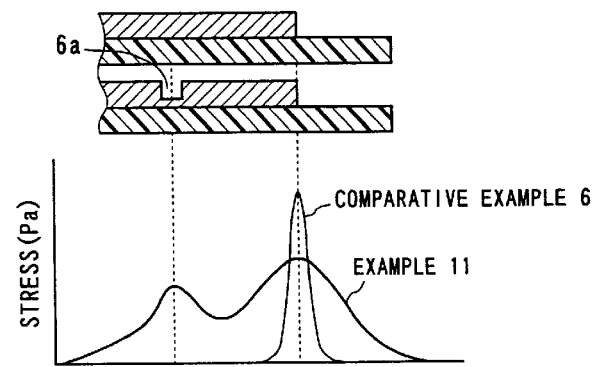
FIG. 19 is a view showing a stress distribution in a ceramic circuit board of Example 11 after the ceramic circuit board was subjected to thermal cycle test (TCT)

Aluminum plate having a thickness of 0.5 mm and a purity of 99% or more was prepared. Then, the aluminum plate was subjected to an etching treatment thereby to form a plurality of holes 6a to an inside the outer peripheral portion of the aluminum plate as shown in FIG. 19. A diameter of each of the holes was set to 0.5 mm, a distance between adjacent holes was set to 0.5 mm, and an outer periphery of each holes was adjusted to be located at a portion apart 0.5 mm from the outer periphery of the aluminum plate. Thereafter, thus etched aluminum plate was directly bonded to an aluminum nitride substrate having a thickness of 0.7 mm thereby to manufacture a ceramic circuit board of Example 11.

EXAMPLE 12

Aluminum plate having a thickness of 0.5 mm and a purity of 99% or more was prepared. Then, the aluminum plate was subjected to an etching treatment thereby to form a plurality of grooves 7 to an inside the outer peripheral portion of the aluminum plate. A depth of each of the grooves was set to 0.25 mm, a width of the groove was set to 0.05 mm, and an outer periphery of each of the grooves was adjusted to be located at a portion apart 0.5 mm from the outer periphery of the aluminum plate. Thereafter, thus etched aluminum plate was directly bonded to an aluminum nitride substrate having a thickness of 0.7 mm thereby to manufacture a ceramic circuit board of Example 12.

Comparative Example 6

Aluminum plate having a thickness of 0.5 mm and a purity of 99% or more was prepared. The thinned portion, holes, or grooves formed in Examples 10–12 were formed at all. Thereafter, this aluminum plate was directly bonded to an aluminum nitride substrate having a thickness of 0.7 mm thereby to manufacture a ceramic circuit board of Comparative Example 6.

With respect to thus manufactured ceramic circuit board of Examples 10–12 and Comparative Example 6, thermal cycle test (TCT) was conducted under a TCT condition of 233K×30 minutes→RT×10 minutes→398K×30 minutes→RT×10 minutes wherein RT denotes a room temperature. When heat cycle was applied to the respective ceramic circuit board, stress distributions were measured.

Figure 20:
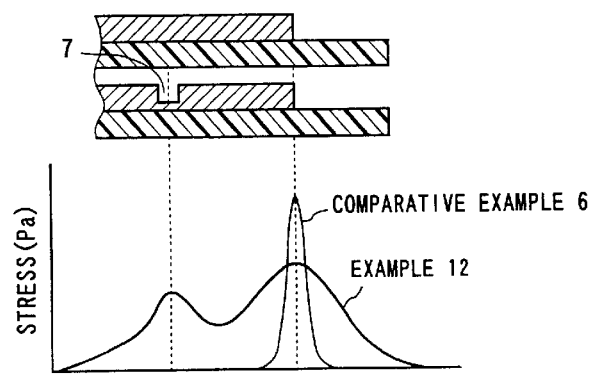
FIG. 20 is a view showing a stress distribution in a ceramic circuit board of Example 12 after the ceramic circuit board was subjected to thermal cycle test (TCT).

The measured results of the respective Examples and Comparative Example 6 are shown in FIGS. 18, 19 and 20. As is clear from the respective Figures, in either case where the thinned portion 3b, holes 6 or grooves 7 were formed to inside the outer peripheral portion of the aluminum plates, the stress caused at inside the outer peripheral portion were effectively mitigated by the thinned portion, holes or grooves, so that the stress caused at a portion close to outer periphery of the aluminum plate can be confirmed to be lowered.

In contrast, in case of Comparative Example 6 in which the aluminum plate was not worked at all, it was confirmed that a large stress was caused at peripheral portion of the aluminum plate, so that there was a fear of the crack formation or the like.

According to the ceramic circuit boards of above Examples, since the thinned portion, holes, or grooves are formed to outer peripheral portion of the metal circuit plate, the thermal stress or residual stress caused in the metal circuit plate are effectively dispersed even if the heat cycle is applied to the ceramic circuit board, so that a stress concentration to the outer peripheral portion of the metal circuit plate can be prevented whereby the crack formation to the ceramic circuit board can be effectively prevented.

According to the ceramic circuit board of the present invention, there can be provided a ceramic circuit board having a high bonding strength and a high-heat cycle resistance and capable of improving operating reliability as an electronic device.

In particular, when a silicon nitride substrate is used as a ceramic substrate, there can be provided a ceramic circuit board capable of exhibiting a remarkable effect of preventing crack formation to be caused by fastening operation performed in assembling process of the ceramic circuit board into devices, and capable of greatly improving an effect of suppressing the crack formation to be caused at the silicon nitride substrate when heat cycle is applied to the ceramic circuit board in comparison with a case where a copper circuit plate is used as the metal circuit plate, whereby an availability and usability particularly in durability of the ceramic circuit board can be increased.

Further, there can be provided a ceramic circuit board capable of contributing to reduce a mounting space for the ceramic circuit board to be mounted on a device without impairing the effect of suppressing crack formation caused by the heat cycle applied to the silicon nitride substrate.

While there has been described what is at present considered to be the preferred embodiments and modifications of the present invention. It will be understood that various modifications which are not described yet may be made therein, and it is intended to cover in the appended claims all such modifications as fall within the true spirit and scope of the invention.

What is claimed is:

1. A ceramic circuit board comprising:
   a ceramic substrate;
   at least one bonding layer that is integrally formed to said ceramic substrate and consists of an Al—Si group brazing material containing 7 wt % or less of Si, or a brazing material containing Al and an alkaline earth metal element or a compound thereof;

an insulating layer integrally formed to said bonding layer, which prevents the brazing material from being alloyed with a metal circuit plate; and a metal circuit plate bonded to said ceramic substrate through said insulating layer.

2. The ceramic circuit board of claim 1, wherein the ceramic substrate is mainly composed of at least one of aluminum nitride (AlN), silicon nitride ($Si_3N_4$) or aluminum oxide ($Al_2O_3$).

3. The ceramic circuit board of claim 1, wherein said insulating layer is composed of a metal paste containing metal powder having a grain size of 10 μm or less, or composed of a metal foil.

4. The ceramic circuit board according to claim 3, wherein said metal for constituting the metal paste or metal foil in said insulating layer is at least one metal of Ni, Sn and In.

5. The ceramic circuit board according to claim 1, wherein said insulating layer has a thickness of 10 μm or more.

6. The ceramic circuit board of claim 1, wherein said metal circuit plate is provided with a thinned portion formed at inside an outer peripheral portion of the metal circuit plate.

7. The ceramic circuit board of claim 6, wherein the length of the thinned portion is 0.3 to 1.0 mm and/or its thickness is ⅙ to ⅚ of a thickness at a mounting surface of the metal plate.

8. A ceramic circuit board of claim 1, wherein said metal circuit plate is provided with a plurality of holes formed at inside an outer peripheral portion of a surface opposing to a bonding surface of the metal circuit plate to which said ceramic substrate is bonded.

9. The ceramic circuit board of claim 8, wherein the diameter and/or interval of the holes ranges from 0.3 to 1.0 mm.

10. A ceramic circuit board of claim 1, wherein said metal circuit plate is provided with a plurality of non-continuous grooves that are provided along an outer peripheral portion of the metal circuit plate and formed at inside an outer peripheral portion of a surface opposing to a bonding surface of the metal circuit plate to which said ceramic substrate is bonded.

11. The ceramic circuit board of claim 1, wherein the width of each groove ranges from 0.05 to 1.0 mm and/or the depth of each groove ranges from ⅙ to ⅚ of a thickness at a mounting surface of the metal plate.

12. The ceramic circuit board according to claim 1, wherein said brazing material is Al—Si alloy.

13. The ceramic circuit board of claim 1, wherein the brazing material contains 12 wt % or less of an alkaline earth metal or compound thereof.

14. The ceramic circuit board of claim 1 comprising a metal circuit plate that is aluminum or an aluminum alloy.

15. The ceramic circuit board of claim 1 comprising a metal circuit plate that is Al—Si alloy.

16. The ceramic circuit board comprising:

a ceramic substrate;

a first bonding layer which is integrally formed to said ceramic substrate and consists of a brazing material or alloy mainly composed of Al, wherein said brazing material contains Si in an amount of 7 wt % or less, an alkaline earth metal element, or a compound thereof;

an insulating layer for preventing the first bonding layer from being alloyed with the metal circuit plate, the insulating layer being integrally formed to said first bonding layer;

a second bonding layer which is integrally formed to a surface of said insulating layer and consists of a brazing material or alloy mainly composed of Al; and a metal circuit plate bonded to said ceramic substrate through said second bonding.

17. The ceramic circuit board of claim 16, wherein the ceramic substrate is mainly composed of at least one of aluminum nitride (AlN), silicon nitride ($Si_3N_4$) or aluminum oxide ($Al_2O_3$).

18. A ceramic circuit board according to claim 16, wherein each bonding layer and insulating layer has a thickness of 10 μm or more.

19. The ceramic circuit board of claim 16, wherein said metal circuit plate is provided with a thinned portion formed at inside an outer peripheral portion of the metal circuit plate.

20. The ceramic circuit board of claim 19, wherein the length of the thinned portion is 0.3 to 1.0 mm and/or its thickness is ⅙ to ⅚ of a thickness at a mounting surface of the metal plate.

21. A ceramic circuit board according to claim 16, wherein said metal circuit plate is provided with a plurality of holes formed at inside an outer peripheral portion of a surface opposing to a bonding surface of the metal circuit plate to which said ceramic substrate is bonded.

22. The ceramic circuit board of claim 21, wherein the diameter and/or interval of the holes ranges from 0.3 to 1.0 mm.

23. A ceramic circuit board of claim 16, wherein said metal circuit plate is provided with a plurality of non-continuous grooves that are provided along an outer peripheral portion of the metal circuit plate and formed at inside an outer peripheral portion of a surface opposing to a bonding surface of the metal circuit plate to which said ceramic substrate is bonded.

24. The ceramic circuit board of claim 16, wherein the width of each groove ranges from 0.05 to 1.0 mm and/or the depth of each groove ranges from ⅙ to ⅚ of a thickness at a mounting surface of the metal plate.

25. The ceramic circuit board according to claim 16, wherein the brazing material for the first, second, or both bonding layers is Al—Si alloy.

26. The ceramic circuit board of claim 16, wherein the brazing material contains 12 wt % or less of an alkaline earth metal or compound thereof.

27. The ceramic circuit board of claim 16 comprising a metal circuit plate that is aluminum or an aluminum alloy.

28. The ceramic circuit board of claim 16 comprising a metal circuit plate that is Al—Si alloy.

* * * * *